United States Patent [19]
Adduci

[11] Patent Number: 5,621,361
[45] Date of Patent: Apr. 15, 1997

[54] ONE-PIN INTEGRATED CRYSTAL OSCILLATOR

[75] Inventor: Francesco Adduci, Milan, Italy

[73] Assignee: SGS-Thomson Microelectronics, S.r.l., Agrate Brianza, Italy

[21] Appl. No.: 454,922

[22] Filed: May 31, 1995

[30] Foreign Application Priority Data

Jul. 1, 1994 [EP] European Pat. Off. ............. 94830329

[51] Int. Cl.$^6$ .................................................... H03B 5/36
[52] U.S. Cl. ...................... 331/75; 331/116 FE; 331/159; 331/185
[58] Field of Search .......................... 331/116 R, 116 FE, 331/158, 159, 75, 185

[56] References Cited

U.S. PATENT DOCUMENTS

| | | | |
|---|---|---|---|
| 3,699,476 | 10/1972 | Mancini | 331/158 |
| 4,193,046 | 3/1980 | Chiba | 331/116 FE |
| 4,603,306 | 7/1986 | Kleinberg | 331/116 R |
| 4,710,730 | 12/1987 | Doyle, III | 331/116 FE |
| 4,782,309 | 11/1988 | Benjaminson | 331/158 |

FOREIGN PATENT DOCUMENTS

| | | |
|---|---|---|
| 0140343 | 5/1985 | European Pat. Off. . |
| 0318320 | 5/1989 | European Pat. Off. . |

OTHER PUBLICATIONS

T. Hougen, "Keep Your Oscillator Simple," EDN Electrical Design News, vol. 29, No. 12, p. 236 Jun. 14, 1984.

E, Nordholt et al., "Single–Pin Integrated Crystal Oscillators," IEEE Transactions on Circuits and Systems, vol. 37, No. 2, p. 175 Feb. 1990.

J. Santos, "A One–Pin Crystal Oscillator for VLSI Circuits," IEEE Journal of Solid State Circuits, vol. SC–19, No. 2, p. 228 Apr. 1984.

M. Soyuer, "Design Considerations for High–Frequency Crystal Oscillators," IEEE Journal of Solid–State Circuits, vol. 26, No. 6, p. 889 Jun. 1991.

*Primary Examiner*—Siegfried H. Grimm
*Attorney, Agent, or Firm*—Robert Groover; Betty Formby

[57] ABSTRACT

A one-pin integrated crystal oscillator in a Colpitts configuration employs a differential amplifier, provided with a feedback network, as an input gain stage. This achieves an enhanced stability and independence from temperature variation, a high Q figure, and a short start-up with a relatively small area of integration.

28 Claims, 3 Drawing Sheets

ONE-PIN INTEGRATED CRYSTAL OSCILLATOR

FIELD OF THE INVENTION

The present invention relates to a crystal oscillator in a Colpitts configuration, monolithically integrable while requiring a single pin for external connection, particularly suited for high density of integration CMOS circuits.

BACKGROUND OF THE INVENTION

The crystal or quartz oscillator is one of the most used circuits in integrated LSI, VLSI and ULSI devices, primarily for generating a highly stable base clock frequency.

Commonly, high frequency crystal oscillators, for example operating above 20 MHz, employ a series-resonant quartz crystal, coupled through a lead of the integrated device, to an integrated oscillator circuit which may have one of many known circuit configurations. For example the oscillator circuit may be realized as a closed loop of inverters connected in series or according to one of other commonly used configurations such as the so called Pierce, Colpitts, Clapp configuration and others yet. Notwithstanding the excellent stability of the frequency of oscillation intrinsic to any quartz oscillator, numerous other aspects of the particular oscillator circuit assume a great importance in designing an integrated device comprising a crystal oscillator. An oscillator circuit based on a closed chain of inverters may have the tendency of oscillating at higher intrinsic frequencies of the quartz crystal, but above all it requires a relatively large area of integration, which is hardly compatible in high density integrated systems (VLSI, ULSI). Pierce, Colpitts or Clapp configured oscillators, as well as the inverter-ring ring oscillator, normally require two pins and several external components. Also this aspect is hardly compatible with the scarcity of available pins in packages containing monolithically integrated complex systems integrated on the same chip and with the general requirement of limiting to the minimum the number of external components.

More recently crystal oscillators have been developed and employed in integrated circuits in Pierce or Colpitts configuration, that require only one pin for connection to the external quartz crystal. The article entitled: "A One-Pin Crystal Oscillator for VLSI Circuits" by Joseph T. Santos and Robert G. Meyer, IEEE Journal of Solid-State Circuits, Vol. SC-19, Nr. 2, Apr. 1984, discloses a one-pin crystal oscillator in a Pierce configuration. The article entitled: "Design Consideration for High-Frequency Crystal Oscillator" by Mehmet Soyuer, IEEE Journal of Solid-State Circuits, Vol. 26. Nr. 6, Jun. 1991, describes the characteristics of different types of series resonant crystal oscillators in various configurations. More generally the volume: "Crystal Oscillator Design and Temperature Compensation" by Marvin E. Frerking, Van Nostrand Reinhold Co., contains a broad review of the known circuits.

Typically an oscillator circuit employs as a gain stage an emitter or source follower and an oscillating tank circuit for selecting a particular resonance frequency of the crystal. Generally high frequency quartz oscillators function with the crystal in a series resonant mode in order to overcome the influence of the parasitic reactances of the circuit. In general, for oscillators working at a frequency comprised between 50 and 125 MHz, the fifth order, natural frequency of resonance of the crystal is used while for higher frequencies a resonance frequency of a higher order, for example the seventh may be used.

In case of integrated oscillator circuits, for the above noted reasons, compensation of the intrinsic impedance of the crystal at its series resonance frequency by using an inductance may be too burdensome and therefore other systems of compensation that do not require the use of external components must be adopted.

However, also the means used for temperature compensating the oscillator must be compatible with the requirements imposed by the use of a single pin and by the requisite of monolithically integrating of the entire circuit.

A Colpitts configured oscillator, fabricated with a bipolar technology, that is employing as a gain stage an emitter follower stage using a bipolar junction transistor (BJT) in a grounded collector configuration, is burdensome in terms of occupied silicon area.

On the other hand, realizing the oscillator circuit with a MOS technology, that is employing a source follower gain stage using a field effect transistor (MOS) in a grounded drain configuration, though reducing the silicon area of integration, may introduce problems of criticality at start-up by delaying the start-up process.

OBJECTS AND SUMMARY OF THE INVENTION

There is the need and/or utility for a crystal oscillator circuit that can be fully integrated and requires a single pin for the connection of the external crystal to the integrated circuit while ensuring an enhanced stability of the frequency of oscillation, a substantial independence of the frequency of oscillation from temperature and a relatively short startup period, though requiring a relatively small area of integration.

These objectives and other advantages are obtained by the crystal oscillator circuit of the present invention.

Essentially the one-pin integrable crystal oscillator of the present invention is a CMOS circuit in a Colpitts configuration, which utilizes as a gain stage a feedback differential amplifier. The circuit presents an input impedance (in parallel to all the capacitances, including the equivalent parallel capacitance of the externally connected crystal), having a negative real part with a modulus higher than the modulus of the real part of the series impedance of the quartz crystal. The differential stage, provided with a feedback network that produces a negative input impedance, behaves as a voltage generator having a certain series resistance that drives the crystal.

The series resistance of the virtual voltage generator that drives the crystal, that is the real part (modulus) of the input impedance of the stage, is at least two times higher than the impedance of a gain stage made with an emitter follower configured bipolar transistor, for the same level of bias currents and set of parameters. In other words, in order to achieve a comparable performance, an emitter follower stage would need to employ much bigger capacitances therefore the present solution offers a marked reduction of the integration area.

On the other hand, as compared with known circuits based on the use of a source follower stage using a MOS transistor, the circuit of the invention ensures a lower start-up time.

In practice, the oscillator circuit of the invention offers the advantages of a MOS implementation of the gain stage without the intrinsic disadvantages of a source follower stage.

By simulating the operation of the circuit, the oscillator made according to the present invention was found to provide an enhanced stability of the frequency of oscillation as compared with the known circuits using an emitter follower stage or a source follower stage. In fact, an important aspect of the circuit of the invention is the weak dependence of the frequency of oscillation or the temperature by virtue of the fact that the reactive part of the input impedance is a weak function of the product $C_1 \cdot g_m$ (n-channel) for the whole considered range of operating temperatures from $-25°$ C. to $125°$ C.

DESCRIPTION OF PREFERRED EMBODIMENTS

Figure 1:
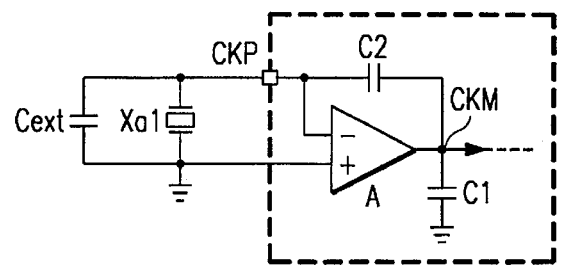
FIG. 1 is a block diagram of an oscillator of the present invention.

With reference to FIG. 1, the crystal Xal is externally connected to the integrated circuit through the single pin CKP required by the integrated oscillator. The capacitance Cext is an external capacitor that can be connected in parallel with the crystal for adjusting the frequency of oscillation. Crystals, as produced by different manufacturers, may in fact present a parallel capacitance Co of slightly different value and therefore by substituting one crystal with another of a different manufacturer, it may be necessary to introduce or modify the value of the external capacitor Cext for adjusting the frequency of oscillation.

The gain stage is constituted by a differential amplifier fed-back through a "capacity transformer" network composed by C1 and C2. The feedback network feeds the output signal with a certain phase and level to the input of the stage in order to start and support oscillation of the circuit.

Figure 2:
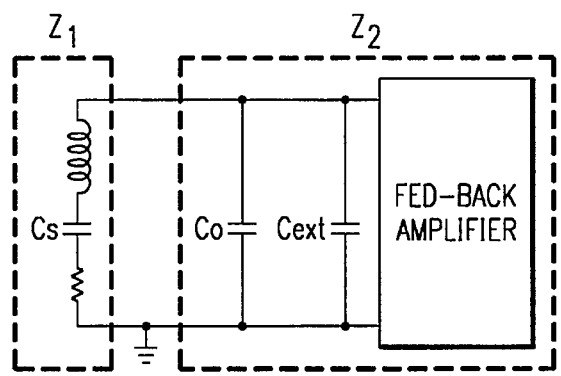
FIG. 2 shows an equivalent diagram of the circuit of FIG. 1.

An equivalent electrical diagram of the coupled impedances is shown in FIG. 2. $Z_1$ represents the series impedance of the crystal, while $Z_2$ represents the input impedance of the gain stage to which the crystal is coupled.

The input impedance $Z_2$ is substantially in parallel to all the capacitances, including the parallel equivalent capacitance $C_0$ of the externally connected crystal, as well as of the eventual external capacitance Cext that may be used for adjusting the frequency of oscillation.

To ensure that oscillation at a certain frequency $f_0$ be stably sustained, the following conditions must be satisfied:

$Re\{Z_2\} \leq Re\{Z_1\}$ $Imm\{Z_2\} = -Imm\{Z_1\}$

Figure 3:
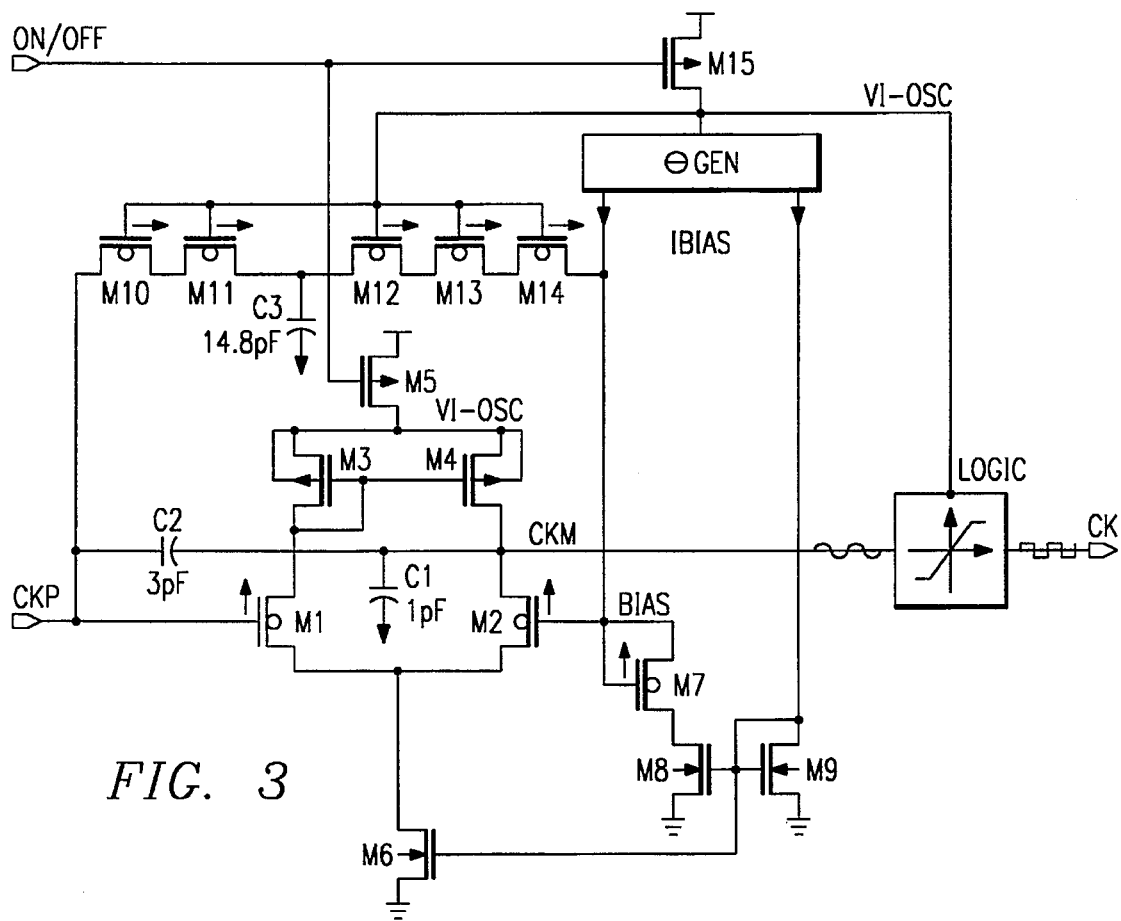
FIG. 3 shows an oscillator circuit made according to the present invention.

A circuit diagram of an oscillator made according to the present invention is depicted in FIG. 3. The differential gain stage is composed by the transistors M1, M2 . . . M6. The "capacitance transformer", feedback network is constituted by the capacitance C1 and C2. The operating point of the gain stage is established by a biasing circuit (BIAS) composed of the generator (Gen) and by the biasing network composed by M7, M8 and M9.

The network composed of the transistors M10, . . . M14 and by the capacitance C3 provides a correct bias to the gate of the transistor M1. Moreover, the capacitance C3, together with M10, M11 on one side and M12, M13 and M14 on the other side, realizes a low pass filter.

An appropriate logic circuit (logic) generates a logic clock signal CK as a function of the output signal CKM of the oscillator.

The transistors M15 and M5 have the function of switches. Preferably they should have an area as large as possible for effectively filtering the supply.

Figure 4:
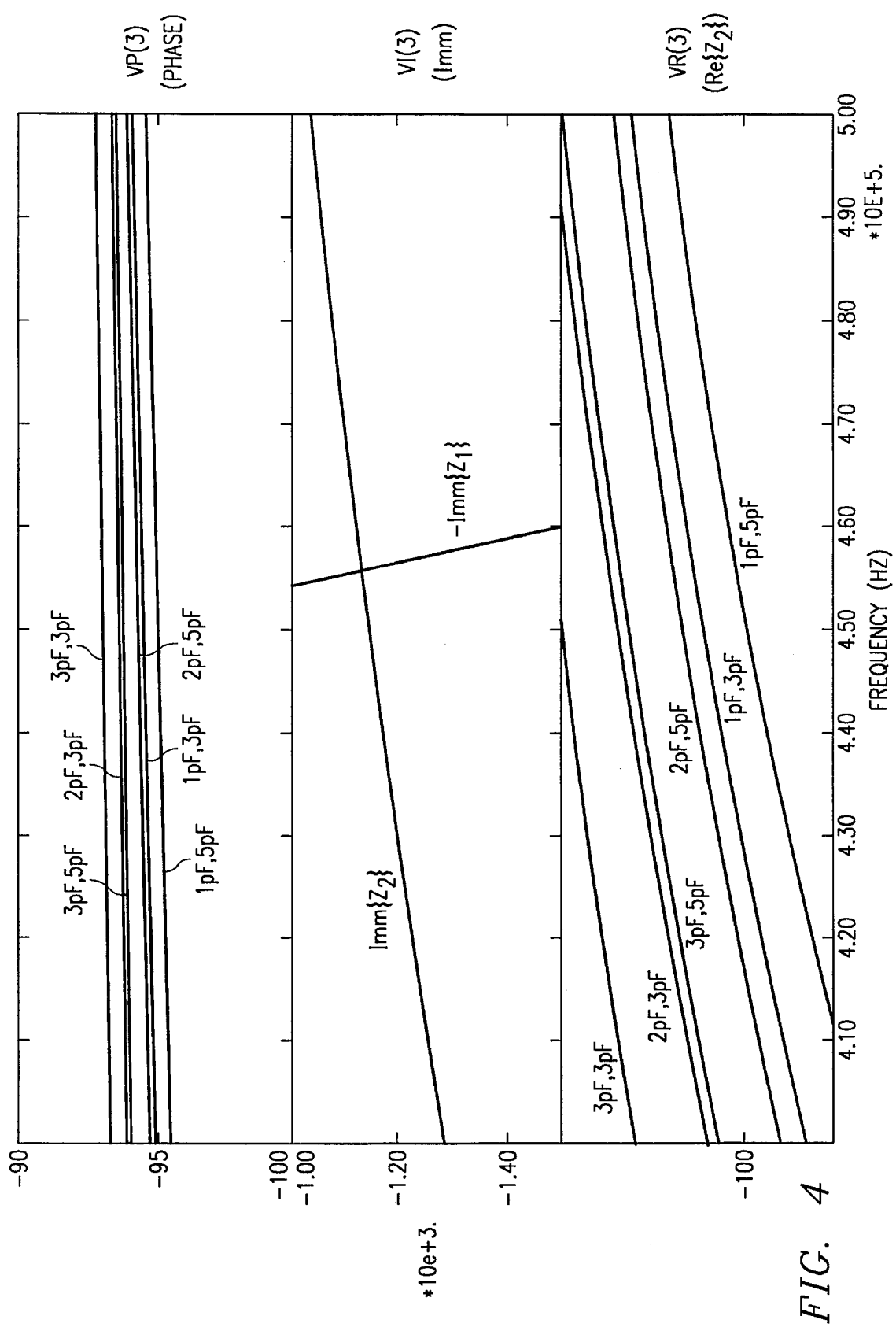
FIG. 4 shows graphs of the input impedance of the oscillator of FIG. 3 as a function of the frequency.

The input impedance curves of the oscillator circuit, respectively for the real part (Re $\{Z_2\}$), and for the imaginary part (Imm) and for the phase (Phase) are shown in FIG. 4, for different pairs of values of the capacitances C1 and C2 of the positive feedback network of the differential amplifier used as the gain stage.

In the graphs relative to the imaginary part $Imm(Z_2)$ of the input impedance, is also shown the imaginary part of the impedance $Z_1$ of the crystal, which intersects the curve $Imm(Z_2)$ in coincidence of the frequency of oscillation.

Figure 5:
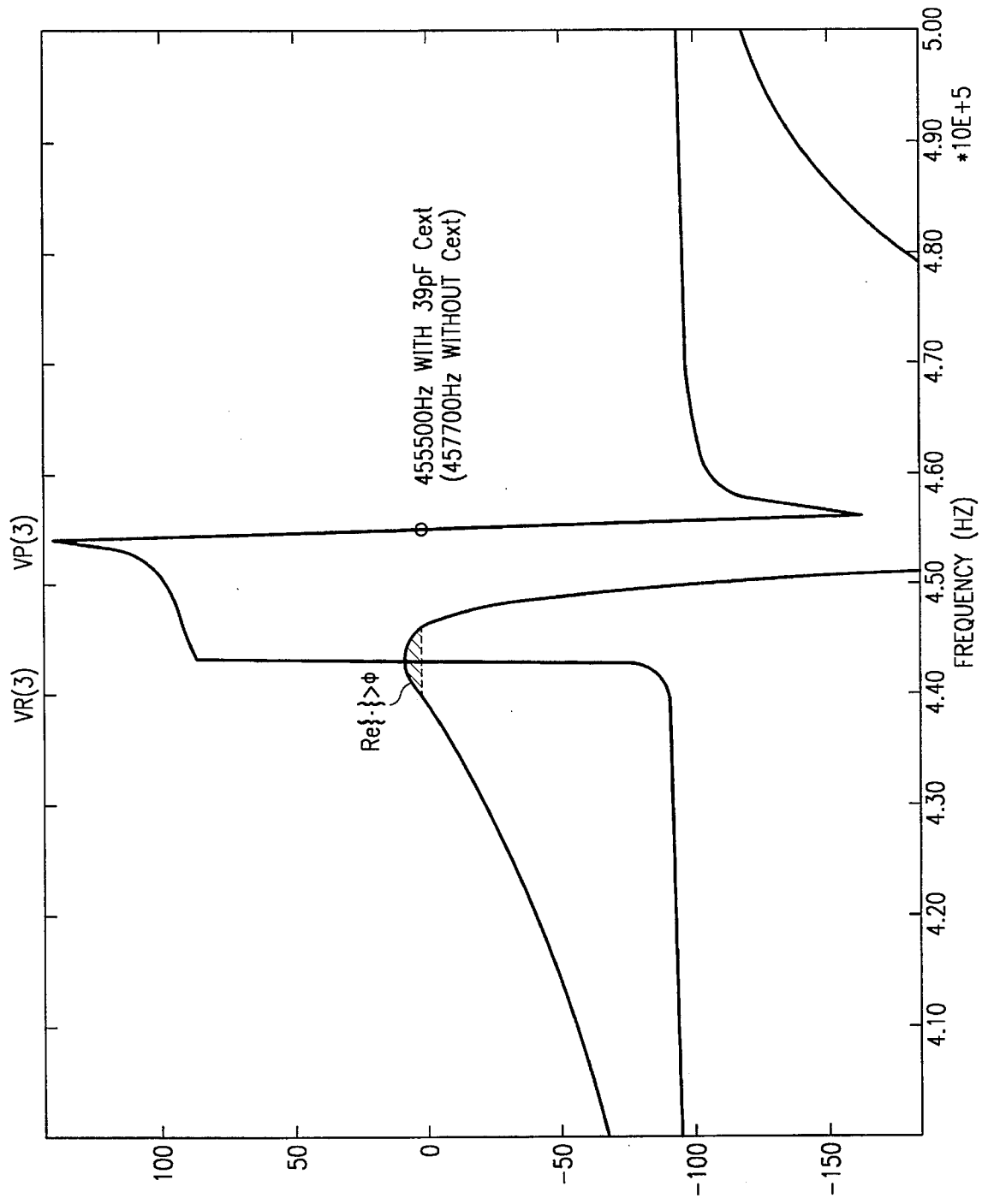
FIG. 5 shows characteristic curves of operation of the circuit of FIG. 3.

FIG. 5 shows characteristic curves of the oscillator obtained with and without an external capacitance Cext of 39 pF.

I claim:

1. An integrated one-pin crystal oscillator circuit comprising:

a CMOS input gain stage consisting of a differential amplifier provided with a feedback network, said feedback network comprising:

a first capacitance directly connected, without added resistance, between an output of said differential amplifier and the input thereof to which a crystal is connected; and a second capacitance directly connected, without added resistance, between the output of said differential amplifier and a common ground node of the circuit.

2. The integrated circuit of claim 1, wherein said first capacitance is larger than said second capacitance.

3. The integrated circuit of claim 1, wherein said first capacitance is about three times as large as said second capacitance.

4. The integrated circuit of claim 1, wherein said amplifier has a differential pair of field-effect transistors connected as an input stage.

5. The integrated circuit of claim 1, further comprising a bias supply connected through a low-pass filter stage to the input of said differential amplifier.

6. The integrated circuit of claim 1, in combination with an external crystal.

7. The integrated circuit of claim 1, in combination with an external crystal and an external capacitor.

8. An integrated circuit crystal-controlled clock generation circuit, comprising:

a pin for connection to a crystal which is also connected to a ground potential;

a differential amplifier having an input connection operatively connected to said pin, and connected to provide an oscillating signal at an output;

a feedback capacitor directly connected, without added resistance, between said output of said differential amplifier and said input connection of said differential amplifier;

a shunt capacitor directly connected between said output of said differential amplifier and said ground potential;

a logic gate having an input connected to said output of said differential amplifier; and said logic gate providing a digital clock signal which is locked to a frequency determined by the crystal;

wherein said circuit CMOS.

9. The integrated circuit of claim 8, wherein said feedback capacitor is larger than said shunt capacitor.

10. The integrated circuit of claim 8, wherein said feedback capacitor is about three times as large as said shunt capacitor.

11. The integrated circuit of claim 8, wherein said amplifier has a differential pair of field-effect transistors connected as an input stage.

12. The integrated circuit of claim 8, further comprising a bias supply connected through a low-pass filter stage to said pin.

13. The integrated circuit of claim 8, in combination with an external crystal.

14. The integrated circuit of claim 8, in combination with an external crystal and an external capacitor.

15. An integrated circuit crystal-controlled clock oscillator comprising:

an external pin for connection to a crystal which is also connected to a ground potential;

a differential amplifier having a first input connection operatively connected to said pin, and a second input connection operatively connected to said ground potential, and connected to provide an oscillating signal at an output;

a first capacitor directly connected, without added resistance, between said output of said amplifier and said first input connection of said amplifier;

a second capacitor directly connected, without added resistance, between said output of said amplifier and said ground potential; and a logic gate having an input connected to said output of said amplifier;

said logic gate providing a digital clock signal which is locked to a frequency determined by the crystal;

wherein said circuit is CMOS.

16. The integrated circuit of claim 15, wherein said first capacitor is larger than said second capacitor.

17. The integrated circuit of claim 15, wherein said first capacitor is about three times as large as said second capacitor.

18. The integrated circuit of claim 15, wherein said amplifier has a differential pair of field-effect transistors connected as an input stage.

19. The integrated circuit of claim 15, further comprising a bias supply connected through a low-pass filter stage to said pin.

20. The integrated circuit of claim 15, in combination with an external crystal.

21. The integrated circuit of claim 15, in combination with an external crystal and an external capacitor.

22. A method for operating an integrated circuit crystal-controlled clock oscillator, comprising the steps of:

connecting an external pin to a crystal which is also connected to a ground potential;

operating a CMOS differential amplifier with an input connection which is operatively connected to said pin, and with a first capacitor directly connected, without added resistance, between said output of said differential amplifier and said input connection of said differential amplifier, and with a second capacitor directly connected, without added resistance, between said output of said differential amplifier and said ground potential; and providing from said differential amplifier an oscillating signal at an output; and providing said output of said differential amplifier as input to a logic gate which derives a digital clock signal therefrom.

23. The method of claim 22, wherein said first capacitor is larger than said second capacitor.

24. The method of claim 22, wherein said first capacitor is about three times as large as said second capacitor.

25. The method of claim 22, wherein said differential amplifier has a differential pair of field-effect transistors connected as an input stage.

26. The method of claim 22, wherein a bias supply through a low-pass filter stage to said pin.

27. The method of claim 22, in combination with an external crystal.

28. The method of claim 22, in combination with an external crystal and an external capacitor.

* * * * *